United States Patent [19]

Yoshikawa et al.

[11] Patent Number: 4,880,515

[45] Date of Patent: Nov. 14, 1989

[54] SURFACE TREATMENT METHOD

[75] Inventors: Masato Yoshikawa, Kodaira; Yukihiro Kusano, Tokorozawa; Kazuo Naito, Kawasaki; Toshio Honda, Akigawa; Tomonobu Hata, Kanazawa, all of Japan

[73] Assignee: Bridgestone Corporation, Tokyo, Japan

[21] Appl. No.: 201,034

[22] Filed: Jun. 1, 1988

[30] Foreign Application Priority Data

Jun. 3, 1987 [JP] Japan .................................. 62-139446

[51] Int. Cl.⁴ ............................................. C23C 14/34
[52] U.S. Cl. ........................ 204/192.12; 204/192.15; 204/298
[58] Field of Search ...................... 204/192.12, 192.15, 204/192.26, 298, 298 PS, 298 ME, 298 PM, 298 SC, 298 SM

[56] References Cited

U.S. PATENT DOCUMENTS

| | | | |
|---|---|---|---|
| 3,627,663 | 12/1971 | Davidse et al. | 204/192.12 X |
| 3,979,273 | 9/1976 | Panzera et al. | 204/192.15 |
| 4,031,424 | 6/1977 | Penfold et al. | 204/192.12 |
| 4,411,763 | 10/1983 | Itaba et al. | 204/192.12 X |
| 4,444,635 | 4/1984 | Kobayashi et al. | 204/192.12 X |
| 4,500,407 | 2/1985 | Boys et al. | 204/192.1 X |
| 4,544,468 | 10/1985 | Munz et al. | 204/192.12 |
| 4,663,009 | 5/1987 | Bloomquist et al. | 204/192.2 |

Primary Examiner—Nam X. Nguyen
Attorney, Agent, or Firm—Oblon, Spivak, McClelland, Maier & Neustadt

[57] ABSTRACT

A substrate is surface treated by a sputtering process by placing the substrate between a pair of targets which are located at a predetermined spacing in a sputtering apparatus, driving atoms out of both the targets, and depositing the atoms on the substrate to form a film thereon.

9 Claims, 2 Drawing Sheets

SURFACE TREATMENT METHOD

BACKGROUND OF THE INVENTION

1. Field of the Invention

This invention relates to a surface treatment method by sputtering, more particularly, to a surface treatment method suitable for the continuous coating of fibers, strands, wires, bars, tubes and other elongated members.

2. Discussion of the Prior Art

A number of dry plating processes have been developed including vacuum deposition, ion plating and sputtering. As compared with film formation by conventional wet plating processes such as electroplating and electroless plating, the dry plating processes have many advantages that they can be applied to a wider variety of objects, coating can be made on a variety of materials, and coating which is unachievable with the wet processes, high functional coating and thin-film formation are possible. Because of these advantages, the dry plating process has quickly spread and is now a key technology covering almost all fields of industry including semiconductor, optoelectronics, recording media, electric appliances, automobiles, tools, and decorations.

The dry plating process suffers from several commercial problems in that the apparatus involved is expensive and complicated because the process has to use a vacuum system and the rate of film formation is not sufficiently high. It is particularly true when objects to be coated are fibers, wires, strands, bars, tubes and other elongated members. The percentage of coating material which is deposited on the outer surface of these elongated objects is lower than when objects to be coated have a generally planar surface. It is difficult to coat the outer surface of elongated objects to a uniform thickness. When it is intended to coat an elongated object at a speed as high as several tens of meters per minute, the apparatus must be greatly extended in the longitudinal direction of the object. The term elongated objects used herein include fibers, strands, wires, bars and tubes and similar members whose cross section may be either circular or non-circular and either solid or hollow.

Referring to FIG. 6, there is schematically illustrated a conventional sputtering apparatus. The sputtering apparatus generally designated as 1 delimits a vacuum chamber in which a target 2 and an object 3 to be coated are placed in an opposed relationship. The target 2 which is made cathode is connected to a DC or RF power source (not shown). With the power on, ions strike the target to drive atoms out of the target material. When the object 3 is a length of fibers, strands, wires, bars, tubes, or other elongated members, atoms of the target material are deposited on the surface portion of the object that is opposed to the target. Only a minor proportion of the atoms is deposited on the rear surface portion of the object, failing to accomplish uniform coating. It is necessary that once the front side of the object that is opposed to the target is coated, the object be rotated such that the rear side is opposed to the target and coating be carried out again, before an equal coating can be formed on the rear side of the object. In addition, the majority of target atoms or coating material is scattered in vain without being collected on the object 3 as shown in arrows in FIG. 6. The percent of target material actually coated is very low.

The same applies when the dry plating process used is vacuum deposition or ion plating.

There is a need for a method capable of dry plating fibers, strands, wires, bars, tubes and other elongated objects uniformly in an efficient and economical manner.

The only prior art known method meeting the requirement is a coaxial hollow sputtering method. A target is attached to the inside wall of a cylindrical vessel and made cathode. A magnetic field is applied from outside the vessel if necessary. Dry plating is carried out on an object disposed in the vessel. Plating can be carried out while the object is continuously moved in an axial direction. This method is satisfactory in uniformity of coating thickness and utilization of target material, but suffers from such disadvantages as troublesome replacement and manufacture of targets and increased cost.

SUMMARY OF THE INVENTION

An object of the present invention is to provide a novel and improved method for treating the surface of a substrate by sputtering which can uniformly dry coat the substrate even when it is in the form of a fiber, strand, wire, bar or tube.

Another object of the present invention if to provide an inexpensive method for treating the surface of a substrate by sputtering in which a higher proportion of target material is deposited on the substrate.

According to the present invention, there is provided a method for treating the surface of a substrate by sputtering, comprising the steps of placing a target and the substrate to be surface treated in a sputtering apparatus, driving atoms out of the target, and depositing the atoms on the substrate to form a film thereon. According to the feature of the present invention, the substrate is placed between a pair of targets which are located at a predetermined spacing whereby atoms driven out of both the targets are deposited on the substrate to form a film thereon.

The method of the present invention is applicable to the surface treatment of fibers, strands, wires, bars, tubes and other elongated object. Preferably, a plurality of fibers, strands, wires, bars or tubes are disposed at a predetermined spacing whereby the plurality of fibers, strands, wires, bars or tubes are treated at the same time. Preferably, the spacing between the fibers, strands, wires, bars or tubes is at least $(\sqrt{2}-1)$ d wherein d is the diameter of the fibers, strands, wires, bars or tubes. Another advantage is obtained by continuously moving the substrate to carry out continuous surface treatment of the substrate.

The method of the present invention is suitable to combine with magnetron sputtering. Preferably, magnets are disposed behind the pair of targets such that the same poles of the opposed magnets face each other, whereby the opposed magnets produce mutually repulsive lines of magnetic force near the surfaces of the targets. Alternatively, magnets are disposed behind the pair of targets such that one polarity pole of one magnet faces the opposite polarity pole of the other magnet, the opposed magnets produce lines of magnetic force in a space therebetween, solenoid coils are disposed outside the magnetic line space and opposed with respect to the substrate, and direct current is supplied to the solenoid coils to form poles which are repulsive to the poles of the opposed magnets behind the targets.

The distance between the substrate and the target is selected based upon productivity, quality of a film to be formed and utilization of a target material. In this case, a short distance results in good productivity or high deposition rate and efficient utilization of a target material. High film quality can be attained by a long distance, i.e. disposing the substrate out of a plasma region, because the film which has been formed is no longer etched by the plasma.

According to the above two magnetron sputtering methods, since a dense plasma region is formed nearly above the surface of the target with a lower height, the substrate can be positioned at a short distance from the target even if it is disposed out of the plasma region, resulting in good productivity or high deposition rate, high film quality and efficient utilization of the target material.

BRIEF DESCRIPTION OF THE DRAWINGS

These and other objects, features, and advantages of the present invention will be better understood by reading the following description taken in conjunction with the accompanying drawings, in which.

DETAILED DESCRIPTION OF THE INVENTION

Figure 1:
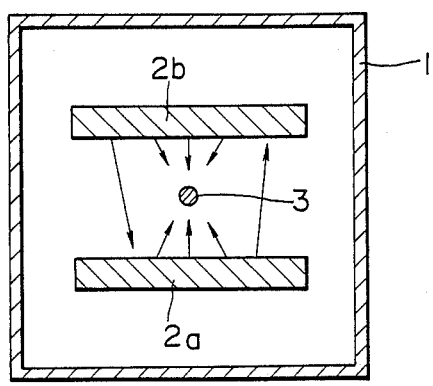
FIG. 1 is a schematic cross-sectional view showing one apparatus used in the practice of the present invention.

According to the present invention, a pair of target are located in an opposed spaced apart relationship. The distance between the targets is not critical and is selected based upon the size of the substrate to be coated. The distance must be enough to allow for successful coating.

A substrate is placed between the pair of the targets. Preferably, the substrate is located in the middle of the pair of targets.

An energy is supplied to drive atoms out of both the targets which are deposited on the substrate to form a film thereon. Target atoms are deposited on the entire surface of the substrate at the same time from the opposed targets. Efficient and uniform dray coating is accomplished even when the substrate is in the form of a fiber, strand, wire, bar or tube. Those target atoms from one target which have not been deposited on the substrate reach the opposed target and condense thereat so that they are utilized again on the opposed target. As a results, the percentage of target material utilized is increased. It is advantageous from the point of view of productivity to continuously move the substrate while carrying out surface treatment. When a plurality of fibers, strands, wires, bars or tubes are surface treated, it is advantageous that they are disposed at a predetermined mutual spacing whereby they are surface treated at the same time. The direction of flight of target atoms propelled out of the targets should be taken into account to make the coating uniform. That is, more uniform coating is obtained when the spacing between the fibers, strands, wires, bars or tubes is at least $(\sqrt{2}-1)$ d wherein d is the diameter of the fibers, strands, wires, bars or tubes which may be usually more 1 $\mu$m, preferably 10 $\mu$m to 100 mm, particularly 100 $\mu$m to 50 mm.

The method of the present invention is preferably practiced by magnetron sputtering. Magnets are disposed behind the pair of targets such that the same poles of the opposed magnets face each other, whereby the opposed magnets produce mutually repulsive lines of magnetic force near the surfaces of the targets. Alternatively, a pair of opposed magnets are disposed behind the pair of targets such that one polarity pole of one magnet faces the opposite polarity pole of the other magnets, the opposed magnets produce lines of magnetic force in a space therebetween, solenoid coils are disposed outside the magnetic line space and opposed with respect to the substrate, and direct current is supplied to the solenoid coils to form poles which are repulsive to the poles of the opposed magnets outside the targets. When surface treatment is carried out under either of these conditions according to the present invention, a dense plasma region is formed in proximity to the surface of each target. This results in an increased sputtering rate, a uniform erosion and consumption of targets and hence, an increased utilization of the targets.

Examples of the present invention are presented below by referring to FIGS. 1 to 5.

EXAMPLE 1

FIG. 1 illustrates one exemplary apparatus which may be used in the practice of the present invention. The sputtering apparatus illustrated includes a vessel 1 defining a vacuum chamber in which a pair of targets 2a and 2b are located at a predetermined spacing. A substrate to be coated 3 is placed between the targets 2a and 2b. Preferably the substrate 3 is placed at a substantially equal distance from both the targets 2a and 2b. With this arrangement, it is possible to connect the targets 2a, 2b as the cathode and the substrate 3 as the anode across a DC high voltage power source. Alternately, RF sputtering is also preferably used in the practice of the method of the present invention. In this case, an RF power source is used.

The substrate 3 is coated in the above-illustrated apparatus according to a conventional procedure, by evacuating the vessel 1 to a high vacuum, of about $1 \times 10^{-3}$ to about $1 \times 10^{-1}$ Torr, and applying DC current of Rf to the targets 2a, 2b to generate a glow discharge to create a plasma. Argon ions in the plasma strike the targets 2a, 2b to drive atoms of target material out of the targets 2a, 2b. The target atoms are then deposited on the surface of the substrate to form a film thereon.

Since the targets 2a and 2b are located on the opposite sides of the substrate 3, target atoms are directed to the substrate from the opposite sides thereof to deposit on the substrate in entirety. Even when the substrate 3 is in the form of fiber, strand, a wire, bar or tube, a uniform coating is quickly formed on the outer surface of the substrate. Continuous coating can be carried out by continuously moving the substrate in its longitudinal direction. The target atoms which are driven out of one target 2a, when they are not intercepted by the substrate 3, will reach the opposite target 2b and condense thereat. These target atoms can be used again, leading to efficient utilization of the target material.

Figure 2:
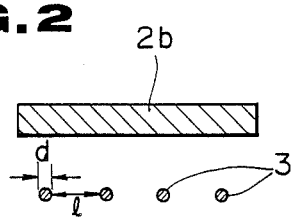
FIG. 2 is a schematic cross-sectional view showing another arrangement used in the practice of the present invention.

The method of the present invention is advantageous particularly when the substrate to be coated is a fiber, strands, wire, bar, tube or other elongated objects. As shown in FIG. 2, a plurality of substrates are disposed at a predetermined mutual spacing between the opposed targets 2a and 2b. Preferably the substrates are arranged on a substantial centerline between the opposed targets. Then the plurality of substrates are coated at the same time. Productivity is increased and the proportion of target atoms deposited on the substrate is increased. The spacing l between the two adjoining substrates is preferably set at least $(\sqrt{2}-1)$ d wherein d is the diameter of the substrate. Then the deposition of target atoms driven out of the targets 2a and 2b onto the outer surface of the substrate 3 is equalized over the entire surface, obtaining a more uniform coating. This is because the majority of target atoms are ejected from the target at an angle with respect to the target surface. In general, the outer diameter of the substrate (wire, bar or tube) may be 1 μm to 100 mm, preferably 10 μm to 100 mm, particularly 100 μm to 10 mm.

EXAMPLE 2

Figure 3:
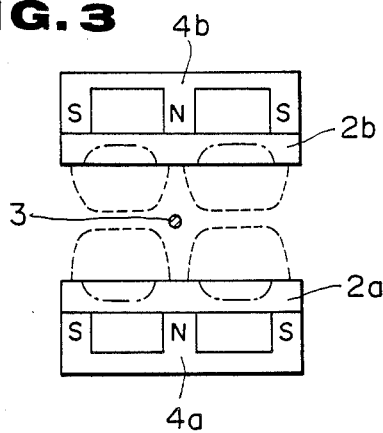
FIG. 3 is a schematic cross-sectional view showing a magnetron sputtering arrangement used in the practice of the present invention.

FIG. 3 illustrates an example in which the method of the present invention is applied to magnetron sputtering.

Figure 4:
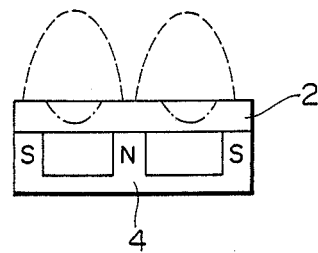
FIG. 4 is a schematic cross-sectional view showing an arrangement used in magnetron sputtering according to the prior art.

In the practice of magnetron sputtering, a magnet 4 is placed behind a target 2 as shown in FIG. 4. The magnet 4 may be either a permanent magnet or an electromagnet and has N and S poles in substantial contact with the target 2. The magnet 4 produces lines of magnetic force near the surface of the target 2 as shown by broken lines. When a negative potential is applied to the target 2, electrons are given high speed cycloid motion along the lines of magnetic force to impinge against rare gas atoms such as argon atoms to split the latter atoms into ions and electrons, creating a high density plasma region in proximity to the target. Positive ions in the plasma inelastically collide against the target 2 at the negative potential to drive out target atoms. The thus driven out target atoms deposit on the substrate to form a film thereon.

In forming a film by magnetron sputtering as described above, one of the factors that govern the film forming rate is how to efficiently create a dense plasma region in proximity to the target 2. To this end, it is useful to increase the component of the lines of magnetic force that extends parallel to the target. If erosion occurs locally with the progress of coating, the target 2 is eroded and consumed in a conical shape in cross section as shown in dot-and-dash lines in FIG. 4. When the apex of the conical erosion reaches the back surface of the target 2, the target 2 must be replaced by a new one. However, if a dense plasma region is created in proximity to the target 2 because of an increased component of the lines of magnetic force which extends parallel to the target, then the sputtering rate is increased and the target is eroded and consumed in a dish shape in cross section. Then consumption of the target is more equalized and the percent utilization of the target material is increased.

Magnetron sputtering as explained above may be carried out effectively by applying the method of the present invention. Magnets 4a and 4b are disposed behind the pair of opposed targets 2a and 2b such that the same poles of the opposed magnets face each other as illustrated in FIG. 3. That is, the S pole of the other magnets 4a is opposed to the same pole of the other magnet 4b and the N pole of one magnet 4a is opposed to the same pole of the other magnet 4b. Then the opposed magnets 4a and 4b produce mutually repulsive lines of magnetic force near the surfaces of the targets 2a and 2b as shown by broken lines. The component of the lines of magnetic force which extends parallel to the targets 2a and 2b is increased whereby a dense plasma region is formed above the surfaces of the targets 2a and 2b.

In the example shown in Fig. 3, a film is formed at an increased rate. In addition, the targets 2a and 2b are eroded and consumed in a dish shape in cross section as shown by dot-and-dash lines so that the targets are utilized more efficiently for a longer life.

The magnets 4a and 4b used in FIG. 3 may be replaced by electromagnets. The electric current which is applied to the electromagnets to create a magnetic field is changed in a periodic, pulsative or random manner to change the magnetic field in a periodic, pulsative or random manner. Then the distribution of the magnetic field in proximity to the surfaces of the targets 2a and 2b is changed, resulting in a more uniform erosion and consumption of the targets, an increase in utilization and life of the targets, and a more uniform coating on the substrate 3.

EXAMPLE 3

Figure 5:
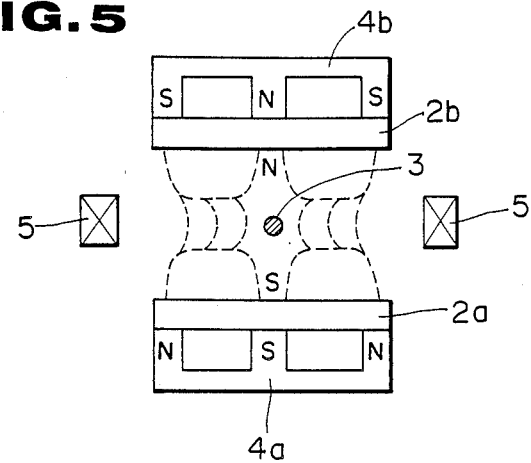
FIG. 5 is a schematic cross-sectional view showing another magnetron sputtering arrangement used in the practice of the present invention.
Figure 6:
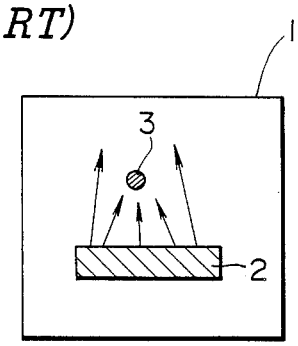
FIG. 6 is a schematic cross-sectional view showing a prior art sputtering apparatus.

FIG. 5 illustrates another arrangement which may be used for carrying out magnetron sputtering according to the method of the present invention. A substrate 3 is disposed between a pair of opposed targets 2a and 2b according to the principle of the present invention. A pair of opposed magnets 4a and 4b are disposed behind the pair of opposed targets 2a and 2b such that one polarity pole of one magnet faces the opposite polarity pole of the other magnet. That is, the S pole of one magnet 4a is opposed to the N pole of the other magnet 4b and the N pole of one magnet 4a is opposed to the S pole of the other magnet 4b. Then the opposed magnets 4a and 4b produce lines of magnetic force in a space therebetween. In addition, solenoid coils 5, 5 are disposed outside the magnetic line space and opposed with respect to the substrate. In the preferred embodiment illustrated, the solenoid coils 5, 5 and the substrate 3 are in alignment with a centerline between the targets 2a and 2b. Direct current is supplied to the solenoid coils 5, 5 to form poles which are repulsive to the poles of the opposed magnets 4a, 4b behind the targets 2a, 2b.

The component of the lines of magnetic force which extends parallel to the targets 2a and 2b is increased whereby a dense plasma region is formed above the surfaces of the targets 2a and 2b. Then a film is formed at an increased rate. In addition, the targets 2a and 2b are utilized more efficiently for a longer life.

Like the example illustrated in FIG. 3, the magnets 4a and 4b used in FIG. 5 may be replaced by electromagnets. The electric current which is applied to the electromagnets to create a magnetic field is changed in a periodic, pulsative or random manner to change the magnetic field in a periodic, pulsative or random manner. Then the distribution of the magnetic field in proximity to the surfaces of the targets 2a and 2b is changed. In addition to or instead of controlled energization of electromagnets 4a, 4b, the electric current which is applied to the solenoid coils 5, 5 may be changed in a periodic, pulsative or random manner to change the distribution of the magnetic field near the surfaces of the targets 2a, 2b. By controlledly energizing the electromagnets and/or solenoid coils to change the distribution of the magnetic field near the surfaces of the targets, the targets are more uniformly eroded and consumed and a more uniform coating is formed on the substrate.

More particularly, in this embodiment, since the relative intensities of the magnetic fields of the magnets 4a, 4b behind the targets 2a, 2b and the solenoid magnets 5, 5 can be electrically adjusted, the density of lines of magnetic force prevailing in proximity to the surfaces of the targets 2a, 2b can be controlled to any desired level. Then the erosion zone where the targets 2a, 2b are eroded as a result of inelastic collision of positive ions is more broadly distributed, resulting in an increased utilization of the targets 2a, 2b. The coating on the substrate becomes more uniform.

In the practice of the present invention, the material and shape of the targets and the substrate are not particularly limited. Sputtering may be carried out under commonly used conditions. The type of sputtering is not limited to DC, RF, and magnetron spattering illustrated in the examples, while arc discharge sputtering, ion beam sputtering and any other sputtering processes may be employed. Other modifications and changes may be made without departing from the scope of claim of the present.

According to the present invention, a substrate is uniformly dry coated in an efficient manner by disposing a pair of targets in an opposed, spaced-apart relationship in a sputtering apparatus, placing the substrate between the targets, driving atoms out of both the targets, and depositing the atoms on the substrate to form a film thereon. A higher proportion of the target material is utilized to form the film. The arrangement of the apparatus is relatively simple and inexpensive. The method of the present invention is particularly suitable for the surface treatment of elongated members such as fibers, strands, wires, bars and tubes. The present method will find a number of commercial applications including uniform coating of aluminum onto glass fibers, coating of metal oxide onto the outer surface of plastic tubes, coating of cobalt onto steel cords, and coating of superconducting metals, intermetallic compounds or superconducting ceramics onto copper wires or carbon fibers.

What is claimed is:

1. A method for treating the surface of a substrate by magnetron sputtering, comprising the steps of:

placing at least two targets and the substrate to be surface-treated in a sputtering apparatus, driving atoms out of the target, and depositing the atoms on the substrate to form a film thereon, wherein the substrate is placed between the pair of targets which are located in an opposed, spaced-apart relationship whereby atoms driven out of both the targets are deposited on the substrate to form a film thereon, and at least one magnet is disposed behind each of the pair of targets such that one polarity pole of one magnet faces the opposite polarity pole of the other magnet, the opposed magnets produce lines of magnetic force in a space therebetween, and at least one solenoid coil is disposed outside the magnetic line space and opposed with respect to the substrate, and direct current is supplied to the solenoid coil to form poles which are repulsive to the poles of the opposed magnets behind the targets whereby the component of the lines of magnetic force which extends parallel to the targets is increased to form a dense plasma region above the surfaces of the targets and the targets are eroded and consumed in a dish shape in cross section.

2. The surface treating method of claim 1 wherein the substrate is selected from the group consisting of fibers, strands, wires, bars, tubes and other elongated members.

3. The surface treating method of claim 1 wherein the substrate comprises a plurality of fibers, strands, wires, bars or tubes disposed at a predetermined spacing whereby the plurality of wires, bars or tubes are treated at the same time.

4. The surface treating method of claim 1 wherein the spacing between the fibers, strands, wires, bars or tubes is at least $(\sqrt{2}-1)$ d wherein d is the diameter of the fibers, strands, wires, bars or tubes.

5. The surface treating method of claim 1 which further comprises continuously moving the substrate to carry out continuous surface treatment of the substrate.

6. The surface treating method of claim 1 wherein electromagnets are disposed behind the pair of targets such that the opposed electromagnets may produce a magnetic field near the surfaces of the targets, and the current applied to the electromagnets is changed in a periodic, pulsative or random manner to change the distribution of the magnetic field.

7. The surface treating method of claim 1 wherein the current applied to the solenoid coils is changed in a periodic, pulsative or random manner to change the distribution of the magnetic field near the surfaces of the targets.

8. The surface treating method of claim 1 wherein said substrate is placed approximately equivalent between the pair of targets.

9. The surface treating method of claim 1 wherein said substrate is coated at a distance from each of said targets such that it is substantially evenly coated.

* * * * *